United States Patent [19]

Mastrangelo

[11] Patent Number: 5,258,097
[45] Date of Patent: Nov. 2, 1993

[54] DRY-RELEASE METHOD FOR SACRIFICIAL LAYER MICROSTRUCTURE FABRICATION

[75] Inventor: Carlos H. Mastrangelo, Ann Arbor, Mich.

[73] Assignee: Ford Motor Company, Dearborn, Mich.

[21] Appl. No.: 974,570

[22] Filed: Nov. 12, 1992

[51] Int. Cl.5 .................. B44C 1/22; B29C 37/00; C03C 15/00; C23F 1/00
[52] U.S. Cl. .................... 156/644; 156/643; 156/651; 156/655; 156/656; 156/657; 156/668
[58] Field of Search ............... 156/630, 643, 644, 651, 156/655, 656, 657, 659.1, 668

[56] References Cited

U.S. PATENT DOCUMENTS

| | | | |
|---|---|---|---|
| 3,539,705 | 11/1970 | Nathanson et al. | 174/68.5 |
| 3,846,166 | 9/1972 | Saiki et al. | 174/68.5 X |
| 4,740,410 | 4/1988 | Muller et al. | 428/133 |
| 4,744,863 | 5/1988 | Guckel et al. | 156/653 |
| 4,849,070 | 7/1989 | Bly | 156/643 |
| 5,149,397 | 9/1992 | Bol | 156/657 |

OTHER PUBLICATIONS

Arthur Adamson, "Physical Chemistry of Surfaces," 5th Ed., pp. 385-387.
Williams et al., "Wetting of Thin Layers of $SiO_2$ by Water," Applied Physics Letters, vol. 25, No. 10, Nov. 1974.
Scheeper et al "Surface Forces in Micromachined Structures," Micromechanics Europe 1990, pp. 26-27.
Guckel et al, "Fabrication of Micromechanical Devices from Polysilicon Films with Smooth Surfaces," Sensors and Actuators 20(1989) pp. 117-122.
Orpana et al, "Control of Residual Stress of Polysilicon Thin Films by Heavy Doping in Surface Micromachining," Transducers '91, pp. 957-960.
Takeshima et al, "Electrostatic Parallelogram Actuators," Transducers '91, pp. 63-66, 1991.
"Surface and Colloid Science," vol. 2, 1969 pp. 25-153.
Lysko et al., "Capacitive Silicon Pressure Sensor Based on the One-Side Wafer Processing", IEEE, 1991, pp. 685-688.
Ishikwa et al., "A Thin Film Capacitive Pressure Sensor", Technical Digest of the 11th Sensor Symposium, 1992, pp. 149-152.

Primary Examiner—William A. Powell
Attorney, Agent, or Firm—Roger May; Richard D. Dixon

[57] ABSTRACT

A dry-release method for sacrificial layer microstructure fabrication is provided in which a structural layer is anchored to a substrate and deposited on a sacrificial layer located therebetween. Thereafter, holes are etched through the structural layer. Some of the holes are covered with a polymer layer, and portions of the sacrificial layer are then etched through the uncovered holes in the structural layer, creating void areas extending to the substrate. Preferably, the void areas also include undercut areas. The void areas are then filled with a protective polymer layer, creating temporary posts that extend from the surface of the substrate to the structural layer. The sacrificial layer is then removed by means of wet etching. The temporary posts provide support for the structural layer against capillary forces which are created by the evaporation of liquids used in the wet etching process. After wet etching of the sacrificial layer is completed, the temporary posts are removed by a dry etching technique. The resulting microstructure consists of a free-standing structural layer that is anchored to the substrate.

20 Claims, 4 Drawing Sheets (a)
(b)
(c)

PRIOR ART

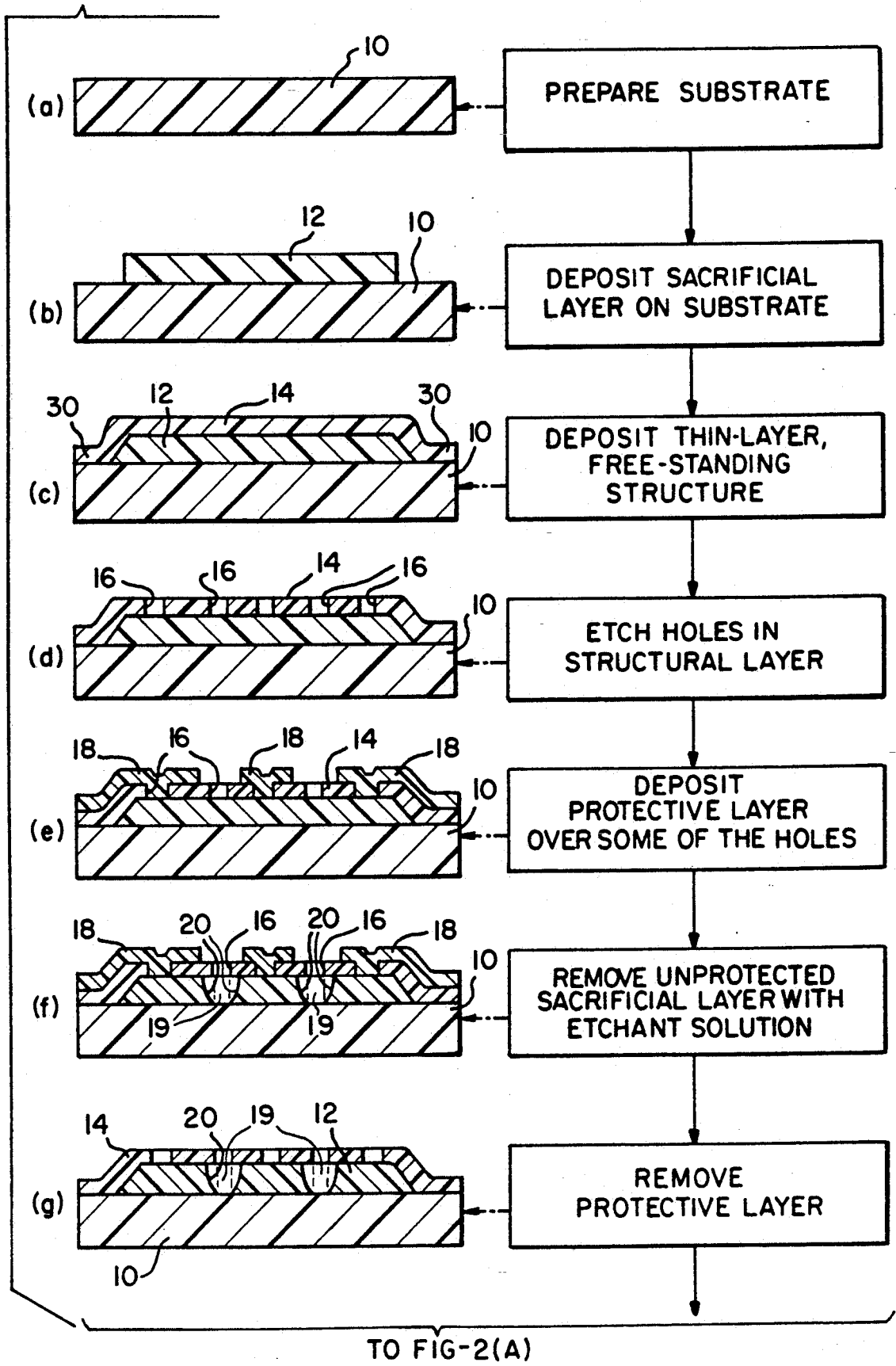

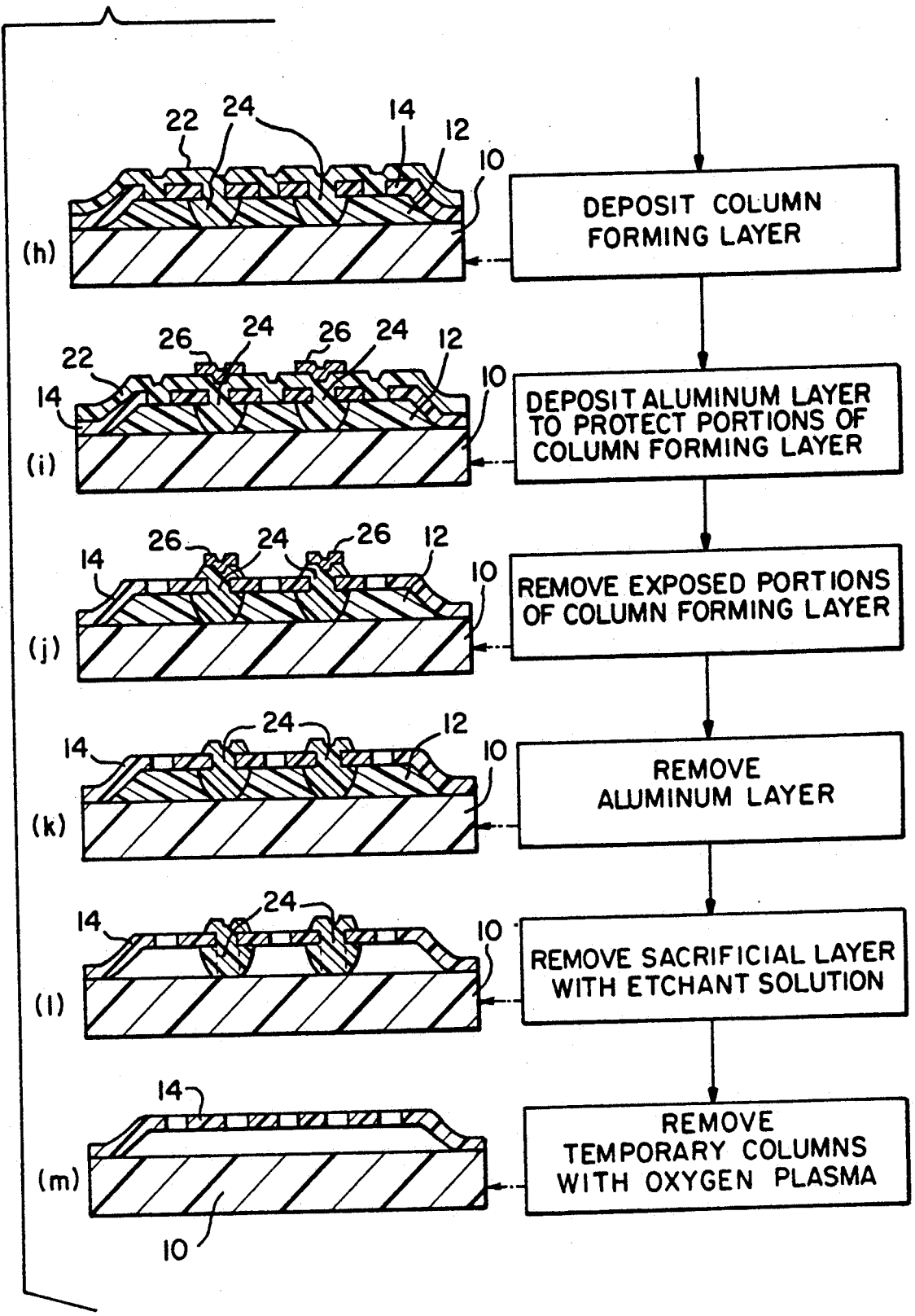

DRY-RELEASE METHOD FOR SACRIFICIAL LAYER MICROSTRUCTURE FABRICATION

BACKGROUND OF THE INVENTION

The present invention relates to microstructure fabrication, and in particular, to a dry-release method for sacrificial layer microstructure fabrication.

The use of microstructures in integrated circuits and other micromechanical structures is becoming increasingly common. Microstructures are currently used as wiring structures in integrated circuits, as parts of microelectronic components, and as micromechanical structures such as movable joints, levers, gears, sliders, and springs.

In order to build microstructures, a sacrificial layer must first be deposited upon a substrate, and a structural component or layer deposited upon the sacrificial layer. The sacrificial layer is then removed, leaving a substrate with a structural component attached to, but spaced from the substrate. Generally, two types of methods are currently used to remove the sacrificial layer. One type is the wet-release method, and the other type is the dry-release method. However, problems exist with each method.

In wet-release methods, during sacrificial layer removal, capillary forces develop between the structural layer and the substrate which tend to deflect the structural layer towards the substrate, causing it to undesirably adhere thereto. In a typical wet-release method, illustrated in part in FIGS. 1(a)–1(c), an etching solution or etchant is applied between the substrate 2 and structural layer 4 to remove the sacrificial layer. The sacrificial layer is then rinsed away by a rinsing solution 6, as shown in FIG. 1(a). As the etching and rinsing solutions 6 evaporate from the small space between the structural layer 4 and substrate 2, strong capillary forces between the two are created. As the volume of liquid trapped beneath the structural layer 4 decreases by evaporation, the capillary forces become stronger. As a result of these forces, the structural layer 4 begins to deflect toward the surface of the substrate 2, as shown in FIG. 1(b). If the capillary forces are strong enough and the structural layer 4 weak enough, the structural layer 4 contacts the substrate 10. At that point, intersolid forces are the strongest, and the structural layer 4 may be permanently pinned to the substrate 2. Therefore, a need exists for a method that prevents the destructive effects of capillary forces associated with wet etching techniques.

To overcome the destructive effects of the capillary forces, dry-release methods have been developed. While the dry-release methods for removing sacrificial layers are not troubled by capillary forces, they have their own distinct drawbacks. For example, the dry-release method of Saiki et al, U.S. Pat. No. 3,846,166, requires deposition of a structural layer on a sacrificial resin layer. However, because the resin layer melts or degrades at low temperatures, e.g. 300°–400° C., many desirable materials for the structural layer which require higher deposition temperatures cannot be deposited upon the fragile sacrificial resin layer. For example, polysilicon, a preferred material for microstructures, requires a temperature of about 600° C. for deposition.

Similarly, Bly et al, U.S. Pat. No. 4,849,070, teaches a dry-release method for removing a sacrificial layer in which the structural layer is built on top of a solid layer that can later be sublimed to free the structural layer. However, the choice of structural layer materials is again limited to lower temperature materials, as higher temperature materials cause the sublimable layer to disappear before deposition thereon. In addition, Bly et al teaches the production of permanent posts which support the structural layer above the substrate, and form part of the finished microstructure. However, the need exists in many applications for microstructures absent such permanent posts.

Other dry-release methods known in the art include a liquid freezing and sublimation method and a photoresist refill and plasma ashing method. These methods, too, have drawbacks. The liquid freezing and sublimation method is unreliable, and, in part, uncontrollable. The freezing of the liquid between the structural layer and substrate can result in an increase in volume which leads to fracture of the microstructure. The photoresist refill and plasma ashing method is difficult to perform, as careful, time consuming and costly mixing of solutions is required.

Accordingly, there is a need in the art for a novel dry-release method for sacrificial layer microstructure fabrication which avoids the effects of capillary forces created by the wet etching of a sacrificial layer, uses a sacrificial layer upon which a wide variety of structural layers may be deposited at higher temperatures, produces a microstructure without permanent posts, and is simpler and more reliable than the methods currently in existence.

SUMMARY OF THE INVENTION

The present invention satisfies that need by providing a dry-release method for sacrificial layer microstructure fabrication that avoids the destructive effects of the capillary forces created as a result of wet etching techniques, and uses a sacrificial layer upon which many different structural layer materials may be deposited. The finished microstructure produced in accordance with the present method does not contain permanent posts, but rather results in a structural layer which is free-standing and needs no additional support after wet etching of the sacrificial layer. Further, the dry-release method of the present invention is a simple and more reliable method than prior art dry-release methods.

The dry-release method of the present invention produces temporary posts or columns that support the structural layer during the wet etching of the sacrificial layer. Preferably made of a polymer, the posts or columns prevent the structural layer from being pulled toward the substrate by capillary forces as the etching and rinsing solutions evaporate. Thus, deformation of the structural layer and undesirable permanent pinning of the structural layer to the substrate is avoided. The temporary posts or columns extend from the substrate to the structural layer during the wet etching stage, and after removal of the sacrificial layer, are themselves removed by dry etching with plasma to produce a microstructure that contains no posts or columns. The step of dry etching with plasma requires no liquids. Thus, capillary forces are not present, and additional supports are not needed during this step.

The present method thus overcomes the problems of the prior art methods, by providing a sacrificial layer which allows for a variety of structural layers to be deposited upon its surface, and by providing temporary posts which support the structural layer during wet etching. As well, the method of the present invention is a more reliable and simple method than freezing and photoresist refilling dry-release techniques, and produces a microstructure that has no permanent support posts.

These and other advantages of the method will be apparent from the drawings, detailed description and claims which follow.

BRIEF DESCRIPTION OF THE DRAWINGS

FIGS. 2(a)-2(g) and 2A(k)-2A(m) are a series of schematic partial cross-sectional views of the structure resulting from various steps performed in accordance with the method of the present invention.

DETAILED DESCRIPTION OF THE PREFERRED EMBODIMENTS

Figure 1:
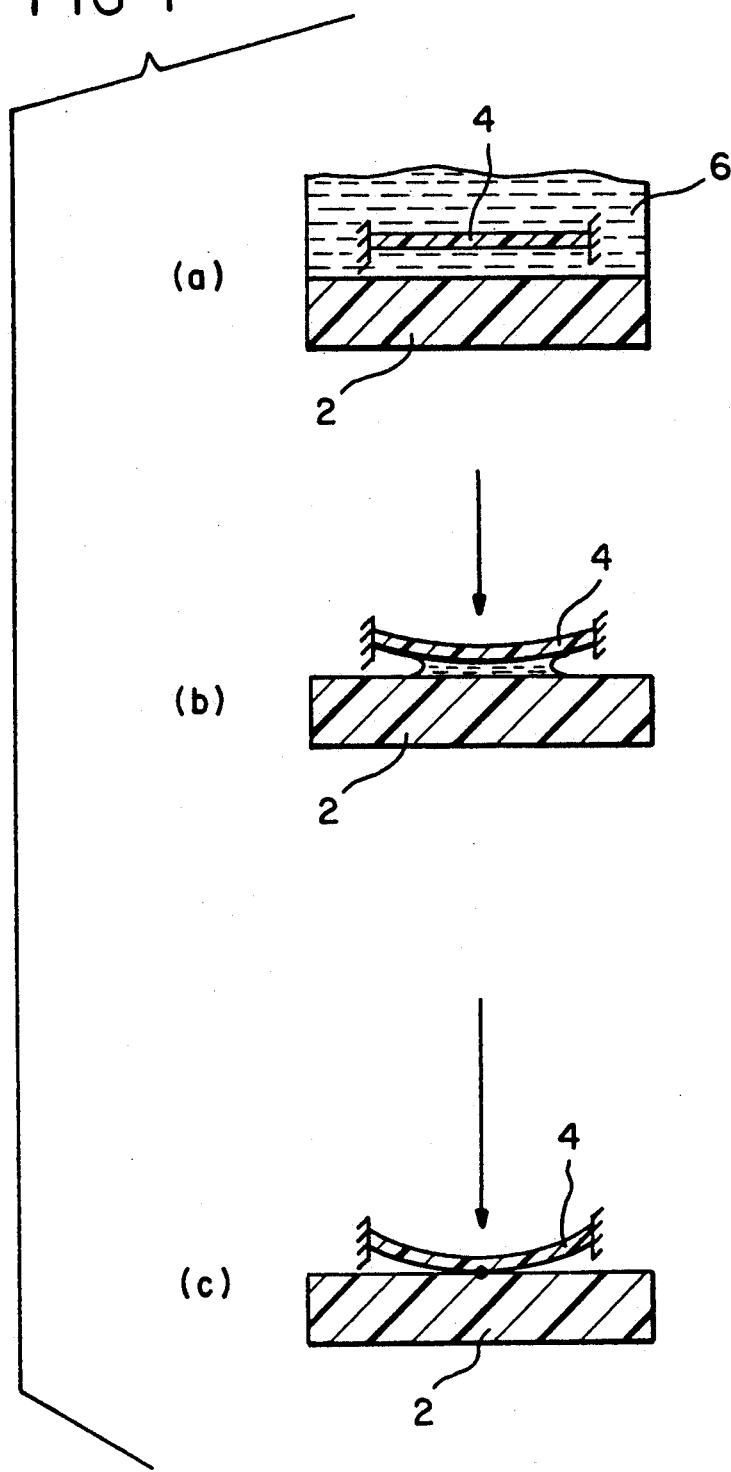
FIGS. 1(a)-1(c) are schematic cross-sectional views of steps performed in prior art wet-etching methods.

Referring now to FIGS. 2(a)-2(m), the method of the present invention will be described in greater detail. As shown in FIG. 2(a), the first step is to provide and prepare a substrate 10 for microstructure fabrication. The substrate 10 may, for example, include silicon, or other conventional substrate materials. Preparation of the substrate 10 may involve nothing more than cleaning and drying its surface. Next, as shown in FIG. 2(b), a sacrificial layer 12 is deposited on a surface of the substrate 10. The sacrificial layer 12 is selected from a group of sacrificial layer materials that can be removed by wet etching techniques. Further requirements for the sacrificial layer 12 are that it is compatible with the structural layer to be deposited thereupon, and can withstand the temperatures required for deposition of the structural layer 14. As well, the sacrificial layer 12 must not sublime at or below the temperature required for deposition of the structural layer. Illustrative of sacrificial layer materials is the preferred material, silicon dioxide. In preparation for the next step, at least two openings are etched through the sacrificial layer 12 to expose the substrate 10. Those openings may be produced by lithographic or other techniques known in the art.

Following deposition of the sacrificial layer 12, the method of the present invention next calls for depositing a structural layer 14 upon the sacrificial layer 12, and anchoring the structural layer to the substrate 10, as shown in FIG. 2(c). The structural layer 14 is deposited over the sacrificial layer 12 in such a manner as to have at least one anchor leg 30, such as the corner of an edge, anchored to the substrate surface through an opening in the sacrificial layer. Two such anchor legs 30 are representatively also shown in FIG. 3 supporting the structural layer 14.

The method next calls for forming at least one temporary post or column 24 extending between substrate 10 and the structural layer 14, as shown in FIGS. 2(d)-2(k). To form such temporary posts 24 or columns, as seen in FIG. 2(d), at least one hole 16, and preferably, a plurality of holes 16 organized as a periodic array, are etched through the structural layer 14 to expose the sacrificial layer 12. Preferably, the array of holes 16 is lithographically defined and etched in the structural layer 14 as known in the art, although other known methods for producing such holes may be used. As next shown in FIG. 2(e), a protective layer 18 which is resistant to sacrificial layer etchant, for example a protective polymer layer such as a photoresist polymer, is applied to the surface of the structural layer 14, covering at least one of the holes 16, while leaving at least one hole 16 uncovered. The protective layer 18 may be so applied by known deposition techniques, and at least one hole 16 uncovered by lithographic or other techniques known in the art.

The structural layer 14 is then preferably immersed in a sacrificial layer etching solution to remove portions of the sacrificial layer 12 where it is exposed through the uncovered holes 16 in the structural layer 14. This partial etching of the sacrificial layer 12 through the holes 16 preferably extends to the substrate 10 to excise void areas 19 which may later be filled to form posts 24 or columns. Preferably, the void areas 19 include undercut areas 20 in the sacrificial layer 12, as illustrated in FIG. 2(f). The protective layer 18 is then removed, as shown in FIG. 2(g), by methods known for the particular protective layer material chosen, such as by applying an etchant.

In its simplest form, the method of the present invention may be practiced where a single hole 16 is produced in the structural layer 14. As such, the steps related to applying and removing the protective layer 18 covering some of the holes, illustrated in FIGS. 2(e) and 2(g) may be omitted, and the step of etching to produce void areas 19 (and the undercut areas 20) illustrated in FIG. 2(f) may be performed directly after the hole 16 is etched in structural layer 14 (FIG. 2(d)).

Regardless, once the void areas 19 are formed in the sacrificial layer 12, a column forming layer 22 resistant to sacrificial layer etchant is deposited through the at least one hole 16 to substantially fill the void area 19 and the undercut areas 20. As well, the column forming layer 22 is deposited on at least a portion of the surface of the structural layer 12. Preferably, the column forming layer 22 is a conformal polymer evenly deposited over the entire surface of the structural layer 12 and into the void areas 19 and undercut areas 20 by vapor deposition techniques, as shown in FIG. 2(h). Generally, the column forming layer 22 may be made of a material which is removable by a dry-release method. Preferably, the column forming layer 22 is the conformal polymer, xylylene, which can be vapor deposited into the undercut area 20 to substantially fill the undercut area 20. The deposition of column forming layer 22 into the void areas 19 and undercut areas 20 creates polymeric posts 24 or columns which are embedded in the sacrificial layer 12 and will later provide support for the structural layer 14 during wet etching of the remaining sacrificial layer 12.

It may be understood from FIG. 2(f) that the void area 19 may be formed with or without the preferred undercut areas 20. Where formed with undercut areas 20, the void areas 19 produce posts 24 or columns having ledges which extend in the shape of the undercut areas 20, as shown in FIG. 2(l), which will resist deformation of the structural layer 14 due to capillary forces. Where absent the undercut areas 20, the void areas 19 will produce posts 24 or columns, as shown in phantom in FIG. 2(l), which only overlap the top surface of the structural layer 14 and support the structural layer 14 by adhesion thereto. In this regard, the area of overlap may be varied to provide a greater or lesser surface area for adhesion, depending on the adhesive force required to support the structural layer 14.

It may also be understood that, in accordance with the present invention, the void areas 19 may be etched in the sacrificial layer 12 to a depth less than the distance between the structural layer 14 and substrate 10. Posts 24 or columns which extend from the structural layer 14 short of the substrate 10 may thereby be formed. During evaporation of the etching solution and rinsing solution the structural layer 14 will deflect somewhat. The shorter posts 24 or columns will, nonetheless, prevent contact between the substrate 10 and structural layer 14 in accordance with the present invention, and prevent pinning problems experienced in the prior art. Shorter pots 24 or columns are not preferred, however, as the spacing between the posts 24 or columns must be made closer, requiring more holes in structural layer 14, and making less free surface area available thereon for use.

The size of the void area 19 etched in the sacrificial layer 12 is determined by the length of time an etchant is applied before rinsing. Because different materials may be used for the sacrificial layer 12 and the corresponding etchant, the rate of etching and, thus, the time of application prior to rinsing, will vary. The rate of etching may be determined by trial and error using methods known in the art for various combinations of etching and sacrificial layer materials, and the size of void area 19 actually produced in a sacrificial layer 12 may be verified by microscopic analysis.

As next shown in FIG. 2(i), a mask layer 26, such as a film of material resistant to plasma etching, is deposited in a pattern over portions of the column forming layer 22 which cover the holes through which the void areas 19 and undercut areas 20 were filled. This may be achieved by depositing a film, as known in the art, by vapor or vacuum, or other techniques, and defining a pattern by lithographic or other known methods. Preferably, the mask layer 26 is a film of aluminum or other conventional metal about 50–100 nanometers (nm) thick. The mask layer 26 protects those portions of the first polymer layer 22 covered by the pattern from etching, and once applied, unprotected portions of the column forming layer 22 are removed by dry-etching, such as by oxygen plasma etching or other known methods, as illustrated in FIG. 2(j). The mask layer 26 is then removed by conventional means.

Thereafter, the remaining portions of the sacrificial layer 12 are removed with an etchant solution, as shown in FIG. 2(l). Preferably, this step includes rinsing the etchant solution and then drying the structure. It is this step in which the capillary forces arise as a result of the evaporation of the etching solution and the rinsing solution. However, the polymeric posts 24 or columns previously formed now support the structural layer 14 and prevent the capillary forces from pulling the structural layer 14 toward the surface of the substrate 10. See FIG. 2(l) and FIG. 3. Finally, the polymeric posts 24 or columns made of the column forming layer (e.g. first polymer 22) are preferably removed by means of a dry-etching technique, such as oxygen plasma etching. As a dry-etching technique is used to remove the posts 24 or columns, no capillary forces are created. The final product is a microstructure which has a free-standing structural layer 14 anchored to the surface of the substrate 10 with at least one anchor leg 30.

The following example is for the purposes of illustrating the preferred embodiment of the present invention, and there is no intent to limit the scope of the present invention and appended claims thereto. In particular, it is intended that the present invention may be practiced with not only the preferred materials described herein, but with other conventional microstructure materials as well. It is well known that etching solutions are known for various microstructure materials which will substantially etch just one of the material layers present during preparation of the microstructure.

EXAMPLE I

In the preferred embodiment, in accordance with the method of the present invention, a silicon substrate 10 was provided, and a sacrificial layer 12 of silicon dioxide, a high-temperature resistant material, deposited thereon. Openings for the anchor legs 30 were made in the sacrificial layer 12. Next, a structural layer 14 of polysilicon was deposited upon the silicon dioxide layer and the silicon substrate by vapor deposition techniques known in the art. At least two anchor legs 30 of the polysilicon structural layer 14 were then anchored to the silicon substrate 10 through the openings in the silicon dioxide sacrificial layer. The preferred polysilicon structural layer 14 material typically, requires a temperature of about 600° C. in order for deposition to occur.

After the polysilicon structural layer 14 was deposited over the silicon dioxide sacrificial layer 12 on the silicon substrate 10, a periodic array of holes 16 was lithographically defined and plasma etched through the polysilicon structural layer 14 to the silicon dioxide sacrificial layer 12 with a gaseous mixture of sulfur hexafluoride ($SF_6$) and pentafluorochloroethane ($C_2ClF_5$). Some of the etched holes 16 in the polysilicon structural layer 14 were then covered by a protective layer 18 of photoresist polymer, and some, but not all, of the holes 16 uncovered by known lithographic techniques.

The photoresist polymer protective layer 18 protected the silicon dioxide sacrificial layer 12 from being etched, except at those uncovered holes 16 through which the silicon dioxide sacrificial layer 12 was then exposed and etched with a solution of buffered hydrofluoric acid (BHF) and water. A standard solution of 5 parts water to 1 part BHF was used for a period of from 30 minutes to 1 hour to etch the void areas 19 and undercut areas 20. Undercut areas extending 5 to 10 microns radially from the circumference of a hole 16 were produced, as preferred for this example. Void areas 19 including undercut areas 20 were thereby created in the sacrificial layer 12.

Next, the photoresist polymer protective layer 18 was removed by known techniques, and a column forming layer 22 of polymer deposited. The material of the column forming layer 22 was a conformal polymer and was deposited from the vapor phase so as to substantially fill the void areas 19 and undercut areas 20. The conformal polymer used was xylylene polymer, which was purchased from Union Carbide under the product name Parylene (hereinafter "Parylene"). Parylene was used for its attractive feature, that it deposits from the vapor phase, thus, making it possible to obtain a complete refill of the undercut areas 20. Such deposition caused the Parylene column forming layer 22 to therefore be deposited upon the entire surface of the polysilicon structural layer 14, as well as in the void areas 19 and undercut areas 20.

Next, a film of material resistant to plasma etching, mask layer 26 of aluminum film, was deposited in a pattern upon the portions of the Parylene layer. The pattern was produced by known lithographic techniques to mask areas over the holes 16 through which the Parylene refilled the void areas 19 and undercut areas 20. The aluminum mask layer 26 protected those portions of the Parylene layer which filled the void areas 19 and undercut areas 20 from removal by etching. Next, the unprotected Parylene was removed by oxygen plasma etching, which is appropriate for the Parylene material. Thereafter, the aluminum mask layer 26 was removed by conventional methods, leaving polymeric columns 24 that extended from the substrate 10 to the polysilicon structural layer 14. The remaining silicon dioxide sacrificial layer 12 was then removed by a wet etching technique. Capillary forces were present during the evaporation of the etching solution and the rinsing solution. However, the polymeric columns 24 created in the earlier steps prevented the polysilicon structural layer 14 from being pulled toward the substrate surface by the capillary forces. After the liquids were all evaporated and the capillary forces dissipated, the polymeric columns 24 were etched by oxygen plasma etching. The final product was a free-standing microstructure elevated and separated from the substrate 10 by at least two anchor legs 30.

In accordance with the present invention, the temporary posts 24 or columns may be located at a maximum column spacing, $d_{max}$, across the structural layer 14. As such, the number of holes in structural layer 14 can be minimized, providing greater free surface area in the finished microstructure for use. Such maximum column spacing may be determined as further set forth in Example II.

EXAMPLE II

The posts 24 or columns may be located at a maximum column spacing $d_{max}$ such that a minimum number of columns are required to be produced. This separation may be defined as follows.

Figure 3:
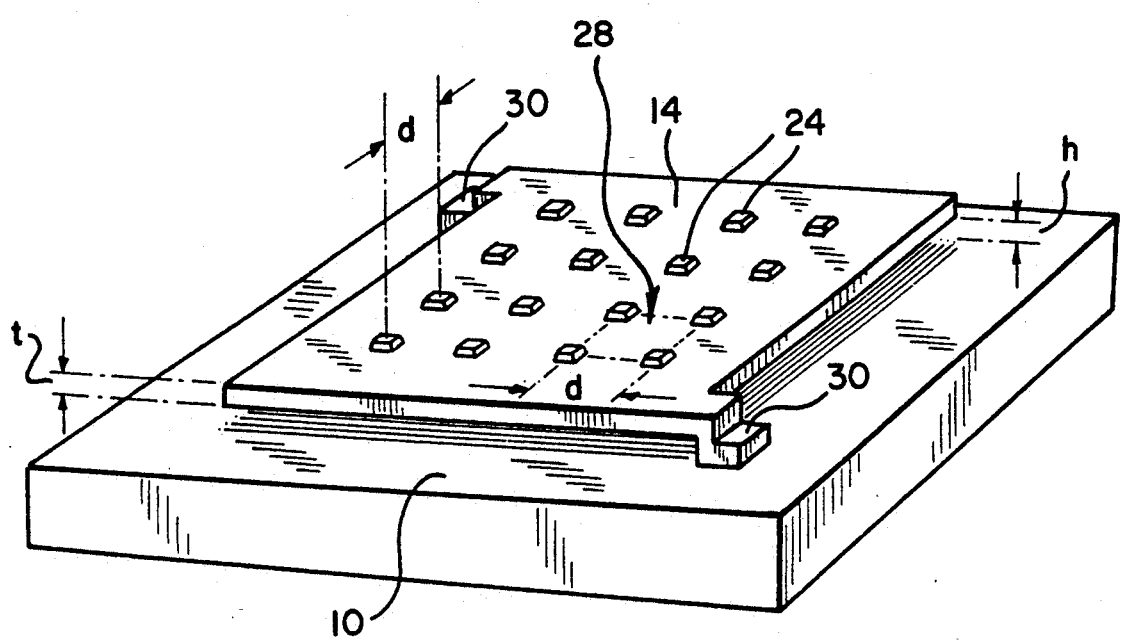
FIG. 3 is a schematic view of the microstructure having the temporary polymeric posts or columns of FIG. 2(l).

With reference to FIG. 3, consider the release of a structural layer 14 by removal of the sacrificial layer 12 beneath it with a liquid etchant, as the release of a large micromechanical plate. The plate of thickness t, elastic modulus E, and gap spacing h is supported by a periodic square array of "rubber feet" columns spaced a distance d as shown in FIG. 3. We may assume that the plate is so large that the deflection of the plate is periodic in d such that only deflections in one "cell" 28 of width d need to be considered. We also assume that the dimensions of the post 24 or column are negligible compared to the cell area. During the drying of the rinsing solution or the sacrificial layer etching solution, the plate experiences a uniform capillary pressure that tends to make the plate touch the substrate 10. It is desirable to find the maximum column spacing $d_{max}$, that prevents the plate from touching the substrate 10. The capillary pressure is $$P_c \approx \frac{2\gamma\cos\theta}{h} \quad (1)$$

where $P_c$ is the capillary pressure, $\gamma$ is the liquid-air surface tension of the solution, and $\theta$ is the contact angle. The contact angle $\theta$ referred to is a ratio of surface energies of liquids and solids, as taught by Adamson in *Physical Chemistry of Surfaces*. Wiley Publishing Co., 1990, as understood by one skilled in the art. The maximum deflection $u_{max}$ of the cell 28 (at its center) mechanically supported at its four corners under the uniform load $P_c$ is given by S. Timoshenko and S.W. Krieger, in *Theory of Plates and Shells*, McGraw-Hill, New York, 1959 as, $$u_{max} = \frac{\alpha P_c d^4}{D} \quad (2)$$

where D is the flexural rigidity of the plate $$D = \frac{Et^3}{12(1 - \nu^2)} \quad (3)$$

and ν is the Poisson's ratio of the plate material. The coefficient $\alpha = 0.00581$ for a square array of posts 24 or columns is also given by S. Timoshenko and S.W. Krieger.

The maximum separation between the posts or columns, $d_{max}$, is determined from the condition $u_{max} = h$. Or equivalently, $$d_{max} = \left[\frac{Et^3h^2}{24\alpha\gamma\cos\theta(1 - \nu^2)}\right]^{\frac{1}{4}} \quad (4)$$

Thus, for example, in accordance with the preferred embodiment of Example I, for a 1 μm-thick polysilicon plate with E=150 GPa and an h=1 μm gap spacing rinsed with water having a surface energy of $\gamma = 72$ mJm$^{-2}$ and an average contact angle $\theta$ of 80 degrees, we calculate a maximum column separation of $d_{max} = 81$ μm for water and silicon. The average contact angle $\theta$ is estimated by reference to R. Williams and A.M. Goodman, "Wetting of thin layers of SiO2 by water", Applied Physics Letters, Vol. 25, No. 10, Nov. 15, 1974. Generally, $\cos\theta$ may be set equal to 1 for a worst case approximation of $d_{max}$, particularly where values for $\theta$ are not readily available.

Accordingly, the maximum spacing of posts 24 or columns may be determined for various materials as may be desired for the structural layer 24, to minimize the number of columns required and maximize the available surface area of structural layer 24.

While certain representative embodiments and details have been shown for purposes of illustrating the invention, it will be apparent to those skilled in the art that various changes in the method and structure disclosed herein may be made without departing of the scope of the invention, which is defined in the appended claims.

What is claimed is:

1. A method for microstructure fabrication comprising the steps of:
   providing a substrate;
   depositing a sacrificial layer upon a surface of said substrate;
   depositing a structural layer on a surface of said sacrificial layer such that said sacrificial layer is positioned between said substrate and said structural layer, and said structural layer is anchored to said substrate;
   forming at least one temporary post extending toward said substrate from said structural layer to support said structural layer;
   removing said sacrificial layer; and
   removing said temporary posts.

2. The method of microstructure fabrication of wherein said step of forming at least one temporary post comprises the steps of:
   etching at least one hole in said structural layer;

applying an etchant through said at least one hole to form a void area in said sacrificial layer, said void area extending toward said substrate from said hole in said structural layer;

depositing a column forming layer resistant to said sacrificial layer etchant through said at least one hole to substantially fill said void area, and applying said column forming layer to at least a portion of said structural layer, whereby said column forming layer in said void area forms a post imbedded in said sacrificial layer; and removing said column forming layer from said structural layer except where said column forming layer extends over said at least one hole.

3. The method of microstructure fabrication of claim 2 wherein said step of removing said column forming layer from said structural layer comprises the steps of:

depositing a film of material resistant to plasma etching in a pattern over the surface of said column forming layer, said pattern overlying each of said holes through which said column forming layer is disposed to substantially fill said void area;

removing said column forming layer generally outside said pattern from said structural layer by plasma etching;

removing said film of material in said pattern.

4. The method of microstructure fabrication of claim 2 wherein said step of applying an etchant through said at least one hole includes forming a void area including an undercut area in said sacrificial layer.

5. The method of microstructure fabrication of claim 2 wherein said step of applying an etchant through said at least one hole includes forming a void area extending from said hole in said structural layer to said substrate.

6. The method of microstructure fabrication of claim 2 wherein said step of depositing a column forming layer resistant to said sacrificial layer etchant through said at least one hole to substantially fill said void area comprises disposing a polymer by vapor deposition in said void area.

7. The method of microstructure fabrication of claim 2 wherein said step of depositing a column forming layer resistant to said sacrificial layer etchant comprises depositing a conformal polymer.

8. The method of microstructure fabrication of claim 2 wherein said step of etching at least one hole comprises etching a plurality of holes in said structural layer in an array.

9. The method of microstructure fabrication of claim 2 wherein:

said step of etching at least one hole comprises etching a plurality of holes in said structural layer; and
said method further comprises the steps of:
covering at least one of said plurality of holes with a protective layer resistant to sacrificial layer etchant; and
after said step of applying an etchant through at least one hole to form a void area, removing said protective layer.

10. The method of microstructure fabrication of claim 9 wherein:

said step of depositing a structural layer comprises depositing a layer comprising polysilicon;
said step of covering at least one of said plurality of holes with a protective layer is performed by applying a photoresist polymer.

11. The method of microstructure fabrication of claim 1 wherein said step of removing said sacrificial layer comprises the step of performing a wet etching technique.

12. The method of microstructure fabrication of claim 1 wherein said step of removing said temporary posts comprises the step of etching said temporary posts using a dry-etching method.

13. The method of microstructure fabrication of claim 12 wherein said step of etching said temporary posts comprises plasma etching.

14. The method of microstructure fabrication of claim 1 wherein said step of depositing a sacrificial layer comprises depositing a high-temperature resistant sacrificial layer capable of remaining substantially unaffected by temperatures of at least approximately 600 degrees centigrade.

15. The method of microstructure fabrication of claim 1 wherein the step of depositing a sacrificial layer includes preparing said sacrificial layer for deposition of a structural layer thereon including the step of etching at least one opening through said sacrificial layer to the surface of said substrate.

16. The method of microstructure fabrication of claim 1 wherein said step of forming at least one temporary post comprises forming said post of a material which is removable by a dry-release method.

17. The method of microstructure fabrication of claim 16 wherein said step of forming said at least one temporary post of a material which is removable by a dry-release method comprises forming said post of a polymer removable by dry-etching techniques.

18. A method for microstructure fabrication comprising the steps of:

providing a substrate;
depositing a sacrificial layer upon a surface of said substrate;
depositing a structural layer on a surface of said sacrificial layer such that said sacrificial layer is positioned between said substrate and said structural layer and said structural layer is anchored to said substrate;
forming at least one temporary post extending between said substrate and said structural layer to support said structural layer, said step of forming including the steps of:
etching at least one hole in said structural layer;
applying an etchant through said at least one hole to form a void area including an undercut area in said sacrificial layer, said void area extending from said substrate to said hole in said structural layer;
depositing a column forming layer resistant to said sacrificial layer etchant through said at least one hole to substantially fill said undercut area, and applying said column forming layer to at least a portion of said structural layer, whereby said column forming layer in said undercut area forms a post imbedded in said sacrificial layer; and
removing said column forming layer from said structural layer except where said column forming layer extends over said at least one hole, said step of removing including:
depositing a film of material resistant to at least one dry etching technique in a pattern over the surface of said column forming layer, said pattern covering each of said holes through which said column forming layer is disposed form said undercut area;

removing said column forming layer generally outside said pattern from said structural layer by said at least one dry etching technique; and removing said film of material in said pattern;

removing said sacrificial layer by a wet etching technique; and removing said temporary posts by a dry etching technique.

19. A method for microstructure fabrication comprising the steps of:

providing a substrate;

depositing a sacrificial layer upon a surface of said substrate; anchoring a structural layer to the surface of said substrate in a manner such that said sacrificial layer is located between said substrate and said structural layer;

etching a plurality of holes through said structural layer to said sacrificial layer;

depositing a protective layer upon at least a portion of said structural layer and over at least one of said holes leaving at least one hole uncovered;

etching portions of said sacrificial layer through said at least one uncovered hole in said structural layer to create a void area associated with said at least one uncovered hole, which void area extends toward the surface of said substrate;

removing said protective layer;

depositing a column forming layer upon at least a portion of said structural layer and into said void area to form temporary posts;

masking portions of said column forming layer filling said void areas with mask material;

etching unmasked portions of said column forming layer;

removing said mask material from portions of said column forming layer;

removing said sacrificial layer; and removing said column forming layer including said temporary posts.

20. The method of microstructure fabrication of claim 19 wherein said step of applying an etchant through said at least one hole includes forming a void area including an undercut area in said sacrificial layer.

* * * * *